(12) United States Patent
Tsai et al.

(10) Patent No.: US 7,256,690 B2
(45) Date of Patent: Aug. 14, 2007

(54) ANTI-THEFT DEVICE

(75) Inventors: Hui-Ming Tsai, Taichung (TW); Chao-Chun Huang, Taichung (TW)

(73) Assignee: E-Chuang Tech. Ltd., Co., Taichung (TW)

( * ) Notice: Subject to any disclaimer, the term of this patent is extended or adjusted under 35 U.S.C. 154(b) by 316 days.

(21) Appl. No.: 11/005,901

(22) Filed: Dec. 7, 2004

(65) Prior Publication Data

US 2005/0104728 A1    May 19, 2005

Related U.S. Application Data

(63) Continuation-in-part of application No. 10/705,326, filed on Nov. 10, 2003, now abandoned.

(51) Int. Cl.
*G08B 13/08* (2006.01)
(52) U.S. Cl. ............. 340/545.1; 340/541; 340/545.6
(58) Field of Classification Search ............. 340/565
See application file for complete search history.

(56) References Cited

U.S. PATENT DOCUMENTS

| | | | | |
|---|---|---|---|---|
| 4,319,232 A | * | 3/1982 | Westphal et al. | 340/604 |
| 4,677,371 A | * | 6/1987 | Imaizumi | 324/544 |
| 4,999,608 A | * | 3/1991 | Galomb | 340/550 |
| 5,712,621 A | * | 1/1998 | Andersen | 340/547 |

\* cited by examiner

*Primary Examiner*—Benjamin C. Lee
*Assistant Examiner*—George A. Bugg
(74) *Attorney, Agent, or Firm*—Apex Juris, pllc; Tracy M. Heims

(57) ABSTRACT

The present invention relates to an anti-theft device which is a transmission line mounted on an object to be protected against theft, such as a door or a window, wherein a safety system is connected to the elongated metal to supply power to the anti-theft circuit of the elongated metal and to detect and judge the signal of the anti-theft circuit of the elongated metal. When the window or the door is broken, the anti-theft device will be easily torn at the respective apertures. At this moment, the safety system cannot receive the signal from the anti-theft device, so it will identify the intrusion of theft and notify the security or guard. Thereby providing an anti-theft function.

5 Claims, 6 Drawing Sheets

ANTI-THEFT DEVICE

This application is a Continuation-in-Part of U.S. patent application Ser. No. 10/705,326, filed Nov. 11, 2003, now abandoned to which application priority is claimed.

BACKGROUND OF THE INVENTION

1. Field of the Invention

The present invention relates to an anti-theft device, and more particularly to an anti-theft device which is a transmission line disposed on an object, such as a window, a door and even a wall, for providing an anti-theft effect.

2. Description of the Prior Arts

A conventional household anti-theft device comprises an anti-theft cable mounted on an object to be protected against theft, such as a door or a window, and a safety system connected to the anti-theft line. If the thief opens the door or window, the anti-theft line will be broken, meanwhile, the safety system will detects the abnormal signal instantaneously so as to notify the security or guard, thereby providing an anti-theft function. However, the anti-theft cable usually has a stiff structure without any torn points, so that the anti-theft cable is not easily broken, thereby decreasing the anti-theft effect.

The present invention has arisen to mitigate and/or obviate the afore-described disadvantages.

SUMMARY OF THE INVENTION

The primary objective of the present invention is to provide an anti-theft device which is a transmission line mounted on an object to be protected against theft, such as a door or a window, wherein a safety system is connected to the elongated metal to supply power to the anti-theft circuit of the elongated metal and to detect and judge the signal of the anti-theft circuit of the elongated metal. When the window or the door is broken, the anti-theft device will be easily torn at the respective apertures. At this moment, the safety system cannot receive the signal from the anti-theft device, so it will identify the intrusion of theft and notify the security or guard. Thereby providing an anti-theft function.

The present invention will become more obvious from the following description when taken in connection with the accompanying drawings, which show, for purpose of illustrations only, the preferred embodiments in accordance with the present invention.

DETAILED DESCRIPTION OF THE PREFERRED EMBODIMENTS

Figure 1:
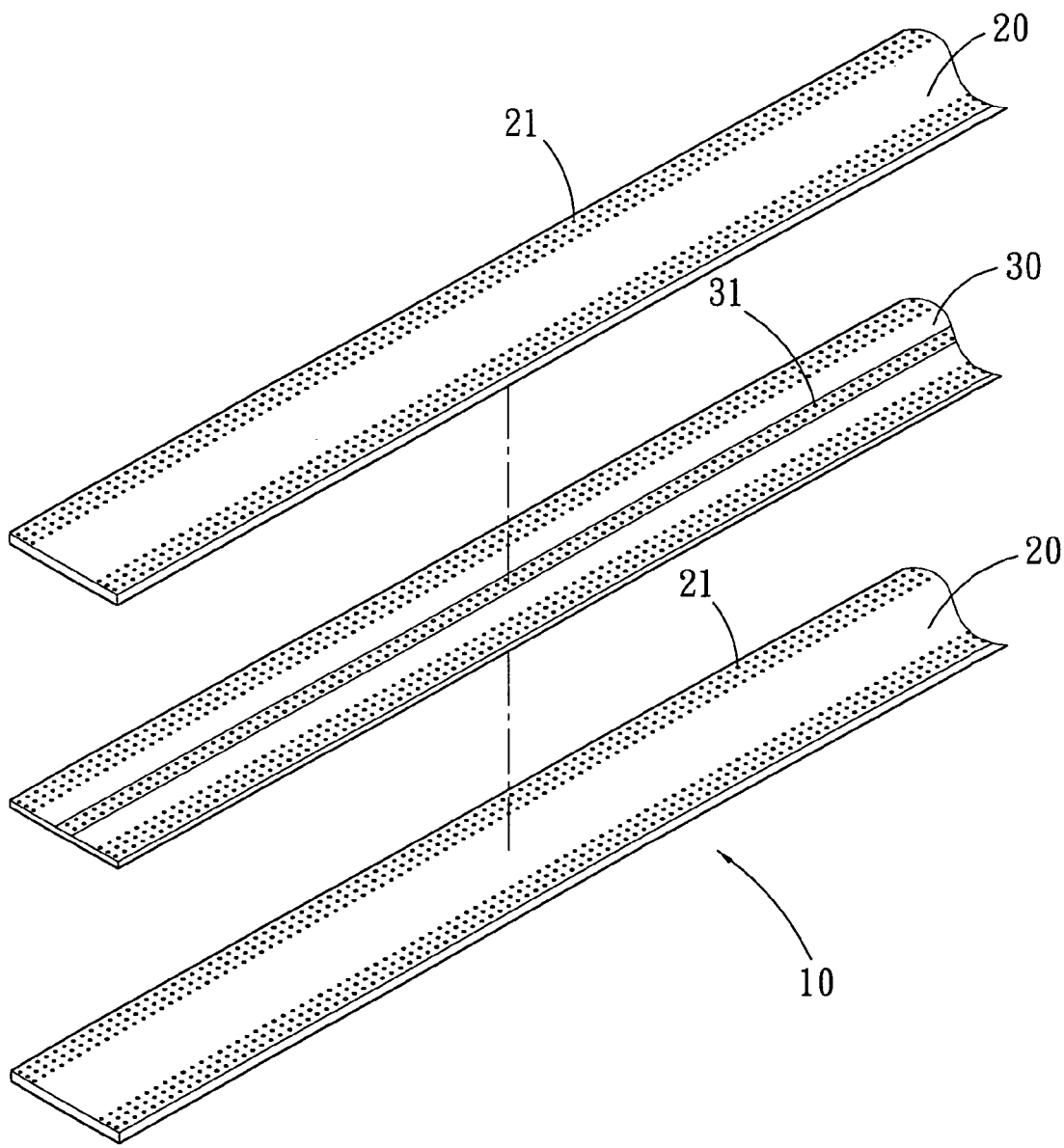
FIG. 1 is an exploded view of an anti-theft device in accordance with the present invention.
Figure 2:
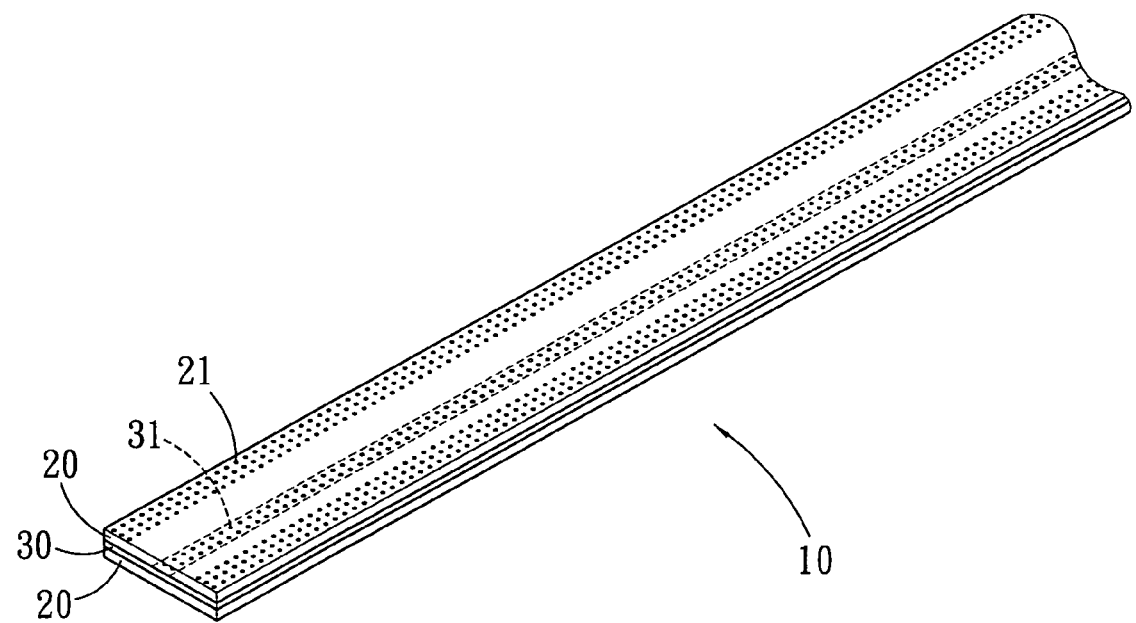
FIG. 2 is a perspective view of the anti-theft device in accordance with the present invention.

Referring to FIGS. 1 and 2, an anti-theft device 10 in accordance with a preferred embodiment of the present invention is a transmission line comprising two elongated flat insulating plates 20 laminated with each other to form an insulating member, and an elongated metal 30 provided with anti-theft circuit is disposed between the two insulating plates 20. The length of the elongated metal 30 is equal to that of the insulating plates 20. Both sides of the elongated metal 30 and the two insulating plates 20 are perforated with a plurality of evenly spaced apertures 21, 31.

Figure 3:
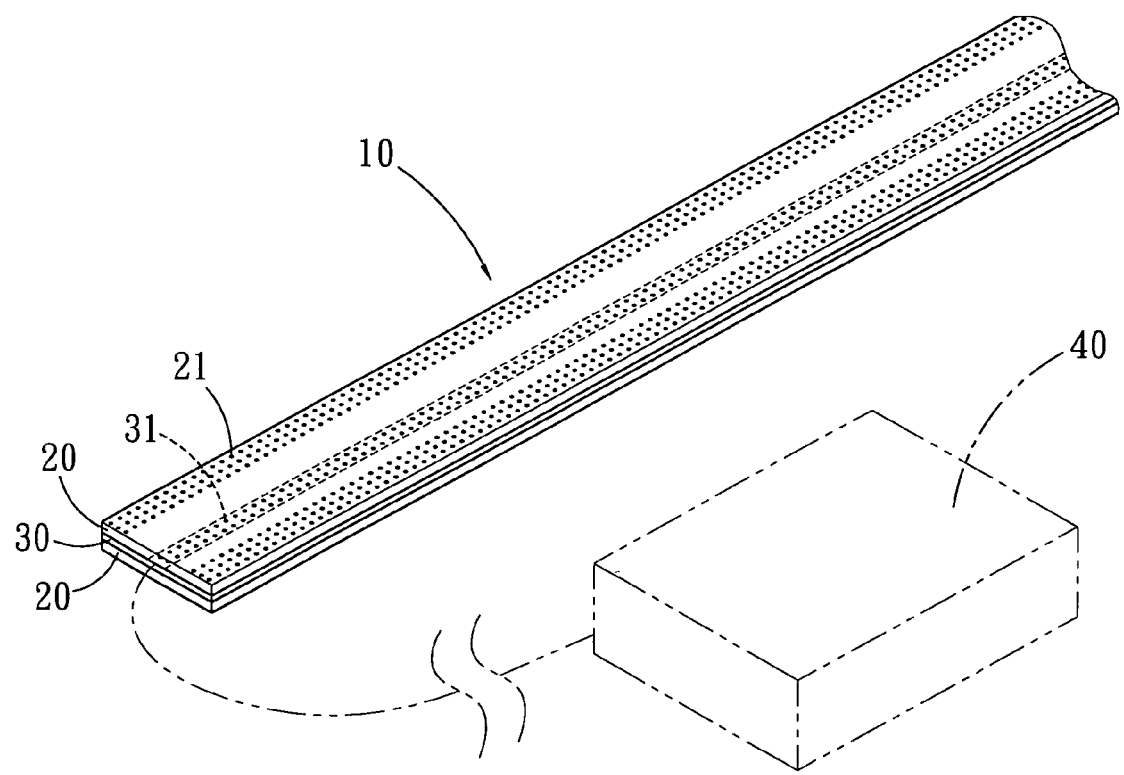
FIG. 3 is an illustrative view of the anti-theft device in accordance with the present invention.

Referring further to FIG. 3, the anti-theft device 10 is mounted on an object to be protected against theft, such as a door or a window. A safety system 40 is connected to the elongated metal 30 to supply power to the anti-theft circuit of the elongated metal 30 and to detect and judge the signal of the anti-theft circuit of the elongated metal 30. When the thief breaks or opens the windows or the doors, the anti-theft device 10 will be easily torn at the respective apertures 21, 31, so that the thief won't be aware.

At this moment, since the anti-theft circuit of the elongated metal 30 inside the anti-theft device 10 is broken, the safety system 40 cannot receive the signal from the anti-theft device 10 anymore, it will identify the intrusion of theft and notify the security or guard. Thereby providing an anti-theft function.

Figure 4:
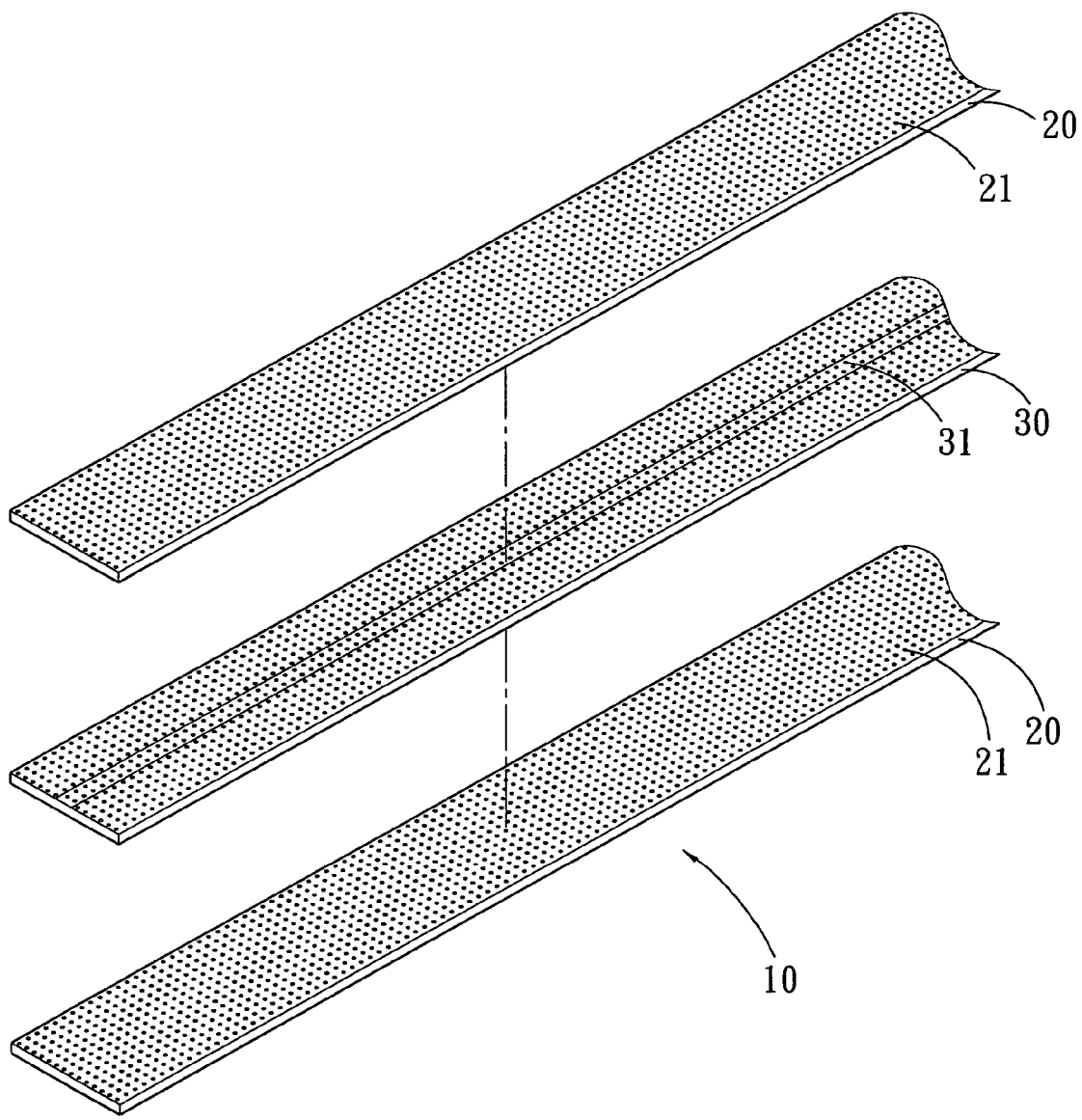
FIG. 4 is an exploded view of an anti-theft device in accordance with a second embodiment of the present invention.
Figure 5:
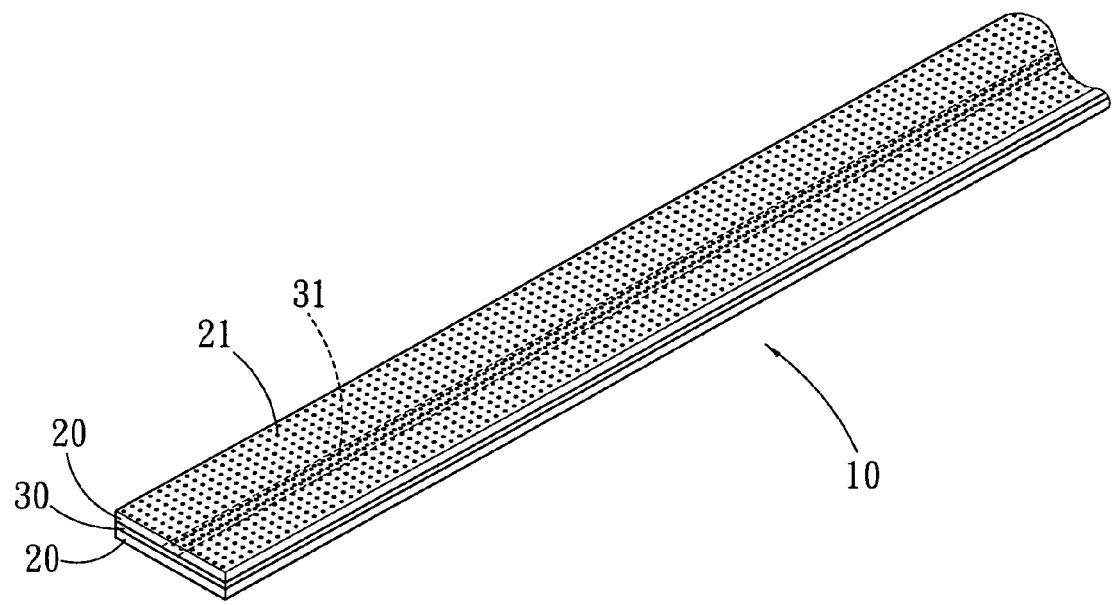
FIG. 5 is a perspective view of the anti-theft device in accordance with a third embodiment of the present invention.

Referring to FIGS. 4 and 5, on the surface of the elongated flat insulating plates 20 and the elongated metal 30 are provided with a plurality of evenly-spaced apertures 21, 31 which make it easy to tear the anti-theft device 10, so that once the safety system 40 receives any abnormal signals from the anti-theft device 10, it will identify the intrusion of theft and notify the security or guard. Thereby providing an anti-theft function.

Figure 6:
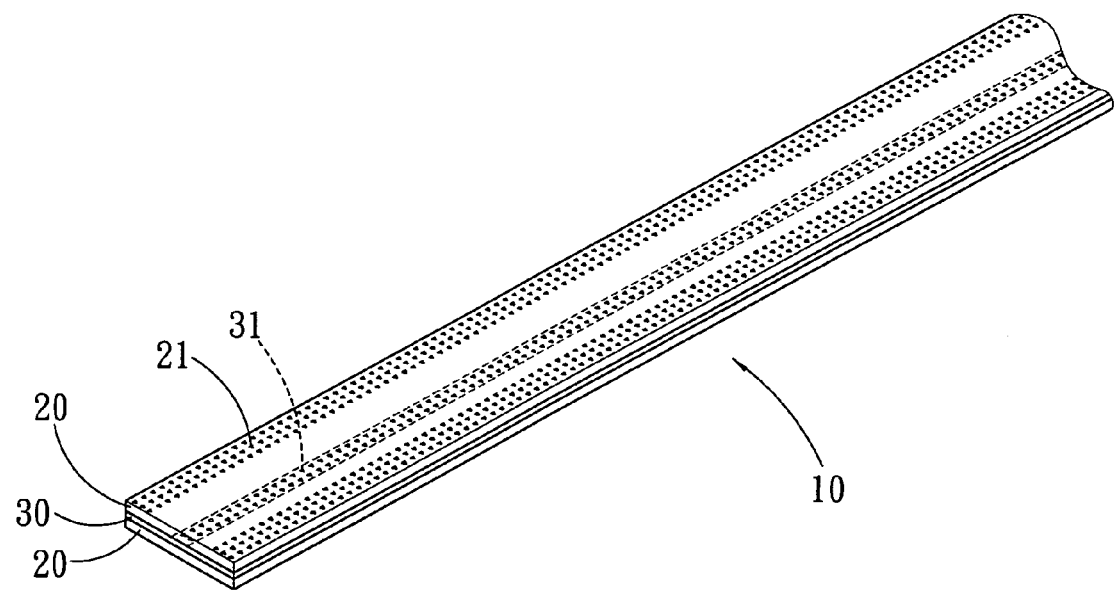
FIG. 6 is a perspective view of an anti-theft device in accordance with a third embodiment of the present invention.

It is to be noted that the aperture 21, 31 on the elongated flat insulating plates 20 and the elongated metal 30 can be made into any arbitrary geometric shapes, such as the round shape of the aperture 21, 31 as shown in FIG. 1 and the triangle shape of the aperture 21, 31 as shown in FIG. 6.

While we have shown and described various embodiments in accordance with the present invention, it should be clear to those skilled in the art that further embodiments may be made without departing from the scope of the present invention.

What is claimed is:

1. An anti-theft device, comprising:
    an elongated metal disposed in an insulating member, the elongated metal being equal in length to the insulating member, and a plurality of apertures provided on the elongated metal and the insulating member;
    wherein the anti-theft device is a transmission line;
    wherein the insulating member includes two elongated flat insulating plates laminated with each other, and the elongated metal is disposed between the two elongated flat insulating plates.

2. The anti-theft device as claimed in claim 1, wherein the apertures are made into an arbitrary geometry shape.

3. The anti-theft device as claimed in claim 1, wherein a safety system is connected to the elongated metal for supplying power to the elongated metal and for detecting abnormal signals of the elongated metal.

4. The anti-theft device as claimed in claim 2, wherein the apertures are round-shaped.

5. The anti-theft device as claimed in claim 2, wherein the apertures are triangle-shaped.

* * * * *